United States Patent [19]

Jeng

[11] Patent Number: 5,486,493
[45] Date of Patent: Jan. 23, 1996

[54] PLANARIZED MULTI-LEVEL INTERCONNECT SCHEME WITH EMBEDDED LOW-DIELECTRIC CONSTANT INSULATORS

[76] Inventor: Shin-Puu Jeng, 2508 Evergreen Dr., Plano, Tex. 75075

[21] Appl. No.: 430,095

[22] Filed: Apr. 26, 1995

Related U.S. Application Data

[63] Continuation of Ser. No. 202,057, Feb. 25, 1994, abandoned.

[51] Int. Cl.⁶ .............................. H01L 21/44; H01L 21/48
[52] U.S. Cl. ........................ 437/195; 437/228; 437/231; 437/235
[58] Field of Search ..................................... 437/187, 235

[56] References Cited

U.S. PATENT DOCUMENTS

| | | | |
|---|---|---|---|
| 4,652,467 | 3/1987 | Brinker et al. | 427/246 |
| 4,710,264 | 12/1987 | Waschler et al. | 437/228 |
| 4,826,786 | 5/1989 | Merenda et al. | 437/195 |
| 4,838,991 | 6/1989 | Cote et al. | 156/643 |
| 4,839,311 | 6/1989 | Riley et al. | 437/228 |
| 4,851,362 | 7/1989 | Suzuki | 437/31 |
| 4,986,878 | 1/1991 | Malazgirt et al. | 156/643 |
| 5,073,814 | 12/1991 | Cole et al. | 357/54 |
| 5,091,289 | 2/1992 | Cronin et al. | 430/312 |
| 5,106,461 | 4/1992 | Volfson et al. | 205/125 |
| 5,155,576 | 10/1992 | Mizushima | 357/71 |
| 5,162,261 | 11/1992 | Fuller et al. | 437/228 |
| 5,212,114 | 5/1993 | Grewal et al. | 437/192 |

FOREIGN PATENT DOCUMENTS

| | | | |
|---|---|---|---|
| 0333132A2 | 9/1989 | European Pat. Off. | 23/50 |
| 62-268144(A) | 11/1987 | Japan | 21/88 |
| 63-179548(A) | 7/1988 | Japan | 21/90 |
| 4-174541 | 6/1992 | Japan | 257/760 |

OTHER PUBLICATIONS

M. A. Hartney, D. W. Hesss, and D. S. Soane; "*Oxygen Plasma Etching For Resist Stripping ANd Multilayer Lithography*";, J. Vac. Sci. Technol. B7 (1), Jan./Feb. 1989; pp. 1–11.

Hidetaka Satou and Daisuke; "*Polymides For Electronic Applications*"; Polymers for Electronic and Photonic Applications, 1993, pp. 221–247.

Primary Examiner—Olik Chaudhuri
Assistant Examiner—H. Jez Tsai
Attorney, Agent, or Firm—John D. Crane; James C. Kesterson; Richard L. Donaldson

[57] ABSTRACT

A multi-level interconnect structure and method. A first plurality of interconnect lines (14) is located on an insulator layer (12) of semiconductor body (10). A first layer of low dielectric constant material (20), such as an organic polymer, fills an area between the first plurality of interconnect lines (14a–c). The first layer of low dielectric constant material (20) has a height not greater than a height of the first plurality of interconnect lines (14). A first layer of silicon dioxide (18) covers the first layer of low dielectric constant material (20) and the first plurality of interconnect lines (14).

12 Claims, 2 Drawing Sheets

5,486,493

PLANARIZED MULTI-LEVEL INTERCONNECT SCHEME WITH EMBEDDED LOW-DIELECTRIC CONSTANT INSULATORS

CROSS-REFERENCE TO RELATED APPLICATIONS

This application is a Continuation of application Ser. No. 08/202,057, filed Feb. 25, 1994, abandoned.

The following co-assigned U.S. patent applications are hereby incorporated herein by reference:

| Ser. No. | Filing Date | Title |
|---|---|---|
| 08/137,658 | 10/15/93 | A Planarized Structure for Line-to-Line Capacitance Reduction |
| 08/201,679 | 02/25/94 | Selectively Filling Narrow Gaps with Low-dielectric Constant Materials |

FIELD OF THE INVENTION

This invention generally relates to semiconductor processing and more specifically to multi-level interconnects with embedded low dielectric constant insulators.

BACKGROUND OF THE INVENTION

Many integrated circuits now contain multiple levels of metallization for interconnections. As device geometries shrink and functional density increases, it becomes imperative to reduce the RC time constant within multi-level metallization systems. The dielectric typically used to isolate metal lines from each other is silicon dioxide. Conventional oxide etches are available for high-aspect-ratio contacts and vias. Silicon dioxide also dissipates heat effectively. However, the dielectric constant of silicon dioxide is on the order of 3.9.

Recently, attempts have been made to replace the silicon dioxide with an organic polymer having a lower dielectric constant. Inorganic compounds have also been used. A lower dielectric constant results in a reduction in the RC delay time. However, the thermal stability and etchability of organic polymers are inferior to that of silicon dioxide.

SUMMARY OF THE INVENTION

An interconnect structure and method is disclosed herein. First, a plurality of interconnect lines are formed on a semiconductor body. Then, a layer of low dielectric constant material is deposited over the semiconductor body and the plurality of interconnect lines to a thickness sufficient to more than fill an area between adjacent interconnect lines. The layer of low dielectric constant material is then etched back to expose an upper surface of the plurality of interconnect lines. Finally, a layer of silicon dioxide is deposited over the plurality of interconnect lines and the layer of low dielectric constant material. In one embodiment, contact vias are then etched through the silicon dioxide layer to the plurality of interconnect lines.

An advantage of the invention is providing a metallization scheme that reduces line-to-line capacitance.

A further advantage of the invention is providing an improved metallization scheme that uses existing production processes.

A further advantage of the invention is providing a metallization scheme that reduces crosstalk and power dissipation.

A further advantage of the invention is providing a dielectric layer in a multi-level metal device that has the advantages of silicon dioxide and has reduced RC delay time.

These and other advantages will be apparent to those skilled in the art having reference to the specification in conjunction with the drawings and claims.

BRIEF DESCRIPTION OF THE DRAWINGS

In the drawings.

Corresponding numerals and symbols in the different figures refer to corresponding parts unless otherwise indicated.

DETAILED DESCRIPTION

Figure 1:
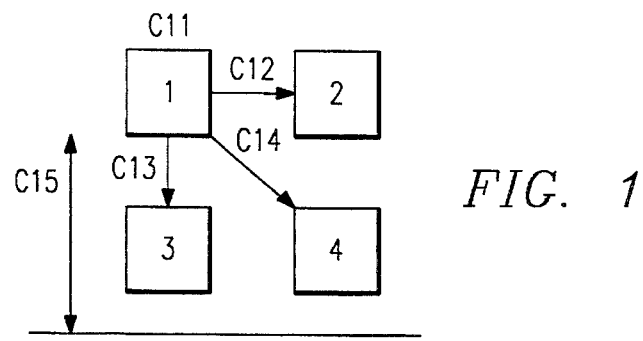
FIG. 1 is a block diagram of a multi-level interconnect device.

FIG. 1 illustrates a vertical sectional view through a device having a ground plane 5 disposed substantially parallel to metal interconnect lines 1, 2, 3, and 4. Electrical signals carried by these interconnect lines 1, 2, 3, and 4 each are affected by the RC time constant of that particular line. In the case of line 1, the capacitance element of the RC time constant is broken into four components. The first capacitance component is capacitance $C_{12}$ which is the line-to-line capacitance between line 1 and line 2. The second component is $C_{13}$ which is the interlayer capacitance between line 1 and the line below it, line 3. The third component is $C_{14}$ which is the interlayer capacitance between line 1 and the line diagonally below line 1, line 4. The fourth component is $C_{15}$ which is the line to ground capacitance between line 1 and ground 5. $C_{11}$ is defined as the total capacitance. The metal width of each of lines 1–4 is 0.36 µm. The line-to-line spacing is also 0.36 µm. The height of metal lines 1–4 is 0.6 µm. The oxide thickness between metal lines is 0.7 µm. Capacitance simulation was completed on the structure of FIG. 1 and the results are shown in Table I.

TABLE 1

| V1 = 1.0000000E+00 | V2 = 0.0000000E+00 |
| V3 = 0.0000000E+00 | V4 = 0.0000000E+00 |
| V5 = 0.0000000E+00 | |

TABLE 1-continued

Solution for bias:
Previous solution used as initial guess

| norm XR Electrode # | P-iter 1 Voltage (Volts) | c-iter Flux (Coul/mic.) | v-error 0.0000E+00 I (Electron) (A/micron) | n-error I (Hole) (A/micron) | p-error I (Total) (A/micron) |
|---|---|---|---|---|---|
| C11 | 1.0000E+00 | 1.0842E–16 | 0.0000E+00 | 0.0000E+00 | 0.0000E+00 |
| C12 | 0.0000E+00 | –9.1582E–17 | 0.0000E+00 | 0.0000E+00 | 0.0000E+00 |
| C13 | 0.0000E+00 | –1.0418E–17 | 0.0000E+00 | 0.0000E+00 | 0.0000E+00 |
| C14 | 0.0000E+00 | –6.4178E–18 | 0.0000E+00 | 0.0000E+00 | 0.0000E+00 |
| C15 | 0.0000E+00 | –5.5909E–21 | 0.0000E+00 | 0.0000E+00 | 0.0000E+00 |

As can be seen from the c-iter column of Table I, the line-to-line capacitance accounts for 85% of the total capacitance in the above example. Of course the percent will vary depending on the line-to-line spacing. As the spacing decreases, the percentage of total capacitance increases. Accordingly, reducing the line-to-line capacitance of closely spaced interconnect lines will have a significant effect on the total RC delay time of a given interconnect line.

The invention will be described in conjunction with a multi-level metallization process. It will be apparent to those skilled in the art that the number of metallization levels may vary and that the invention is equally applicable to single level metal devices.

Figure 2:
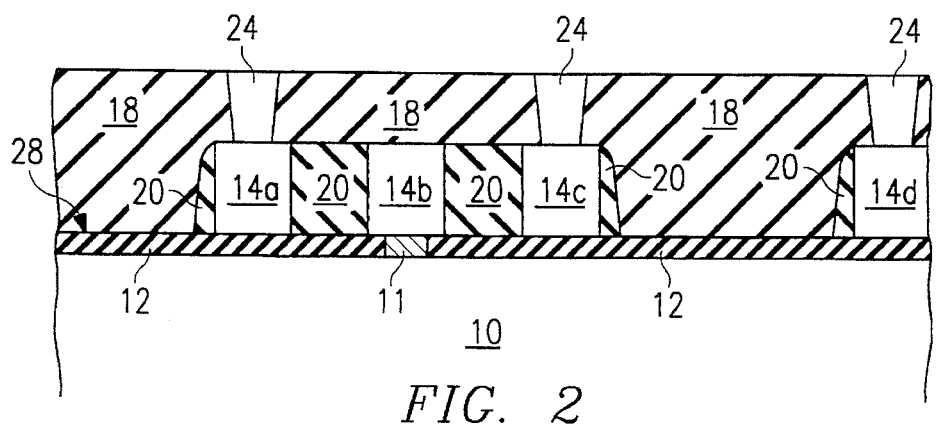
FIG. 2 is a vertical cross-sectional view of an interconnect structure according to the invention.

FIG. 2 shows an interconnect level on a semiconductor body 10, according to the invention. Semiconductor body 10 may, for example contain transistors, diodes, and other semiconductor elements (not shown) as are well known in the art. Semiconductor body 10 may also contain other metal interconnect layers. Insulator layer 12 is formed on the surface of semiconductor body 10 to isolate the structures of semiconductor body 10 from interconnect lines 14. Insulator layer 12 may comprise, for example, an oxide such as silicon dioxide. Contacts, such as contact 11, extend through insulator 12 to connect interconnect lines 14 to semiconductor body 10. Interconnect lines 14 are made of electrically conducting material such as aluminum or a titanium-nitride/aluminum/titanium nitride multilayer although other conductive material may also be employed. Interconnect lines 14a–c are closely spaced (i.e., less than 0.5 micron), but interconnect lines 14c and 14d have a much wider spacing (i.e., >1.0 micron) between them. Layer 20 comprises low dielectric constant material and isolates interconnect lines 14a–c from each other. Low dielectric constant layer 20 may comprise an organic polymer such as TEFLON (i.e., polytetrafluoroethylene), Benzocyclobutene (BCB), parylene, polyimide or other material having a dielectric constant less than 3.9. Parylene is used in the preferred embodiment.

The low dielectric material of layer 20 is placed in areas of the device that have the maximum impact on capacitance. Because the line-to-line capacitance on closely spaced interconnect lines is the most significant contributor to the total capacitance, low dielectric material such as parylene is placed between interconnect lines 14a–c. Silicon dioxide 18 is used elsewhere (i.e., between interconnect lines 14c and 14d) and to isolate interconnect lines 14a–d from subsequently formed elements such as additional interconnect layers (not shown). Contact vias, such as those illustrated at 24 extend through silicon dioxide layer 18 to provide interconnection at desired locations with interconnect lines 14a–d.

There are several advantages to having a composite organic polymer/silicon dioxide dielectric layer. First, high aspect ratio etches, such as those required to form contact vias, are difficult to accomplish in an organic polymer. In contrast, such etches are well known for silicon dioxide. Second, passing high current through a metal line can cause the metal line to rise up in some places. This is known as hillock/void formation. Silicon dioxide suppresses the hillock/void formation to a much greater degree than organic polymers. Third, because the low dielectric constant material 20 has a dielectric constant lower than silicon dioxide, the line-to-line capacitance is reduced. Fourth, heat generated in a metal line can dissipate more easily through silicon dioxide than through an organic polymer. Fifth, the surface of silicon dioxide is planarized for lithographic patterning. Finally, the silicon dioxide layer provides a barrier against mechanical instability of organic polymers. Thus, the advantages of silicon dioxide are combined with the advantage of reduced line-to-line capacitance due to the low dielectric constant layer 20.

Figure 3:
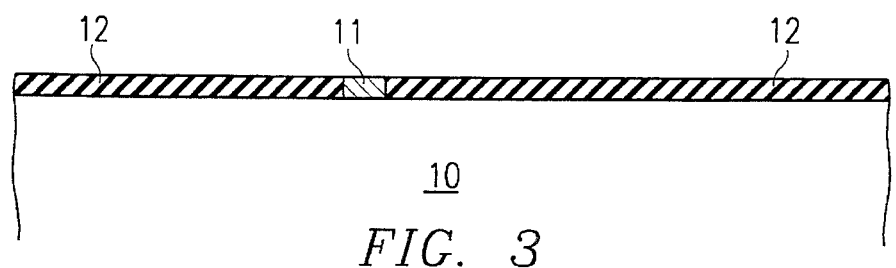
FIGS. 3–7 are vertical cross-sectional diagrams showing sequential stages of fabrication of the structure of FIG. 2.

FIG. 3 shows a semiconductor body 10 after the formation of transistors and other device elements (not shown). One or more interconnect layers may have also been formed in semiconductor body 10. Insulator layer 12 and contacts 11 are formed on the surface of semiconductor body 10.

Figure 4:
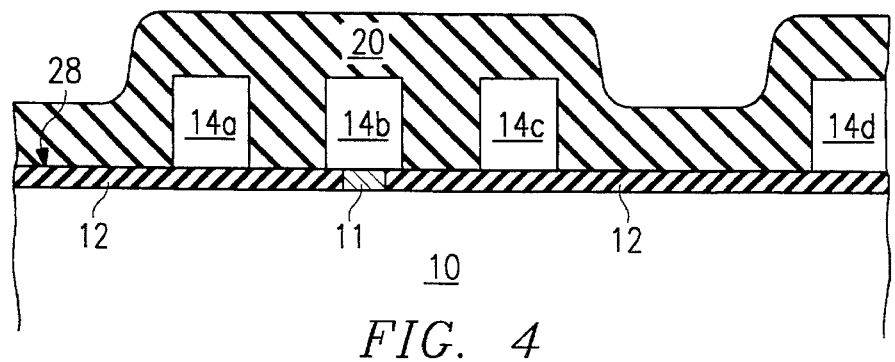

Referring to FIG. 4, a metal layer is deposited and etched to form interconnect lines 14. For simplicity, FIG. 4 shows four interconnect lines 14a–d. However, it will be apparent to those skilled in the art that many other interconnect lines as well as other geometries may also form part of interconnect lines 14. Interconnect lines 14 have a vertical thickness on the order of 0.5–2.0 μm and a horizontal thickness which varies by design, but will typically be in the range of 0.25 to 1 micron. After the formation of interconnect lines 14, a thin layer of silicon dioxide (not shown) may optionally be deposited over the surface of the structure. However, since this layer of silicon dioxide is optional, it will not be shown in the drawings.

Figure 5:
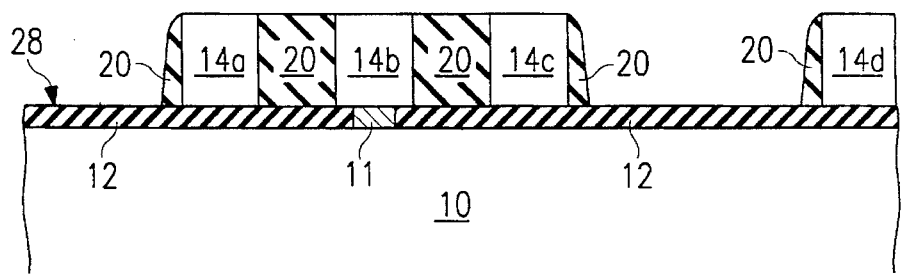

Still referring to FIG. 4, a layer of low dielectric constant material 20 is deposited over the surface of the structure to a thickness on the order of 0.2–5.0 μm. Layer 20 is deposited to a thickness sufficient to more than fill the area between interconnect lines 14a–c. Preferably, layer 20 has a thickness, t, less than W/2s, where W is the spacing between interconnect lines 14c and 14d (i.e., the spacing between interconnect lines for which low dielectric constant material is not desired), and s is the step coverage of dielectric on the sidewall. Vapor deposited polymer like parylene can form a continuous, highly conformal film around interconnect lines and on open field areas 28. The thickness of the film on the top of metal interconnects is the same as that on open field areas 28. Next, layer 20 is etched back such that no materials of layer 20 remains above or extends higher than the upper surface of interconnect lines 14 or on open field areas 28, as shown in FIG. 5. Methods for etching layer 20 are well known in the art. For example, an oxygen plasma etch with a small amount of $CF_4$ gases may be used. It should be noted that in areas where interconnect lines 14 are not spaced close together (i.e., between interconnect lines 14c and 14d), layer 12 may be exposed after the etchback although some low dielectric constant material will remain on a sidewall of those interconnect lines (14a, 14c, and 14d) as illustrated in FIG. 5. As such, the open field area between, for example, interconnect lines 14c and 14d is substantially free, i.e., substantially unfilled, of low dielectric constant material.

Figure 6:
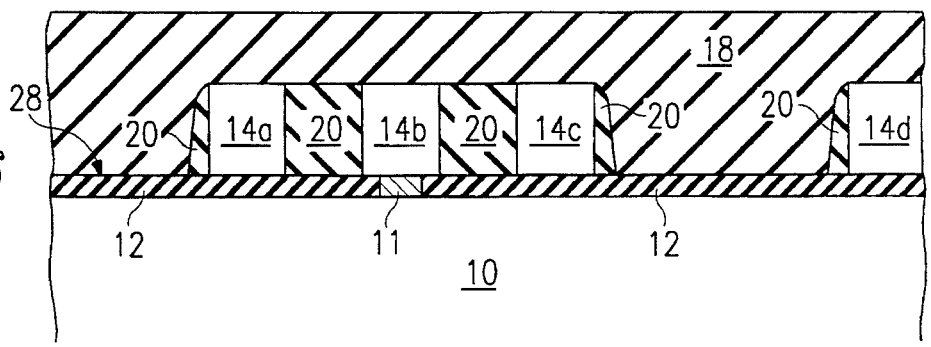

Referring to FIG. 6, a layer of silicon dioxide 18 is deposited over layer 20 and interconnect lines 14, as well as over any exposed regions of layer 12. Silicon dioxide layer 18 has a thickness on the order of 0.5–3.0 μm. Silicon dioxide layer 18 may be planarized according to techniques well known in the art. For example, a chemical mechanical polish or a sacrificial etch-back process may be used.

Polymers may be less dimensionally stable than silicon dioxide (i.e., polymers can creep or deform). In the proposed scheme, polymer on open field areas is removed by etchback process, and is replaced with more dimensional stable silicon dioxide. As for the remaining organic polymer between interconnect lines, the top silicon dioxide layer and metal interconnect sidewalls provide a barrier (confinement) against its dimensional instability.

Figure 7:
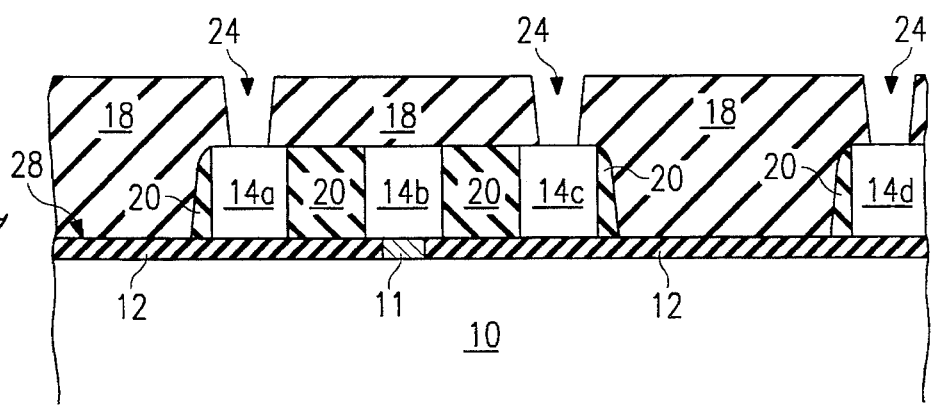

Next, contact vias 24 are patterned and etched through silicon dioxide layer 18 to interconnect lines 14 according to conventional techniques, as shown in FIG. 7. One advantage of the invention is that conventional contact/via etches may be used while achieving a shorter RC delay time. This is due to the fact that silicon dioxide layer 18 remains where vias are desired, but organic polymer 20, with low dielectric constant is used in the space between adjacent interconnect lines which has the effect of reducing the RC time constant for the interconnect line. Finally, a metal layer is deposited and etched to fill vias 24, resulting in the structure of FIG. 2.

Figure 8:
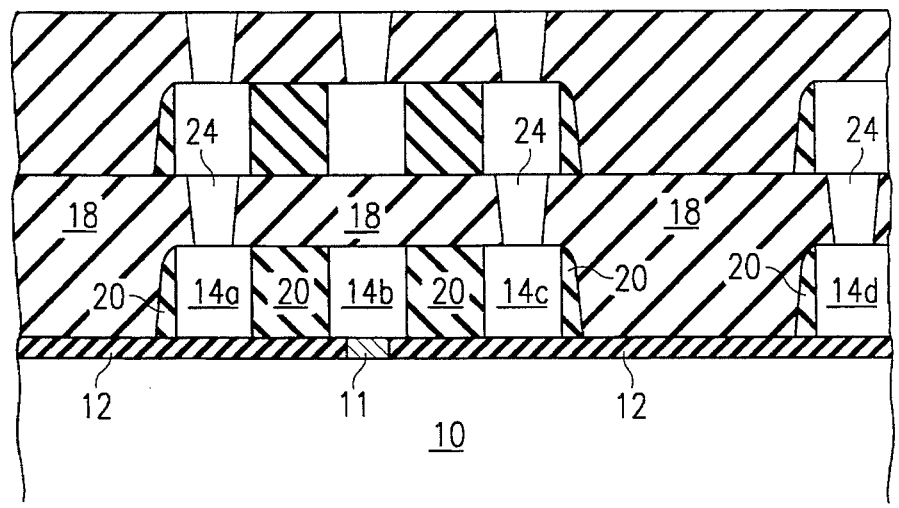
FIG. 8 is a vertical cross-sectional view of a multi-level interconnect structure according to the invention.

After the formation of the structure of FIG. 2, the process may be repeated to form additional metal interconnect layers, as shown in FIG. 8. Typically, three or four such metal interconnect layers may be formed. However, the invention is equally applicable to devices having only a single or double metal interconnect as well as those having more than four levels of interconnect.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming an interconnect structure on a semiconductor body, comprising the steps of:

a. forming a plurality of spaced interconnect lines on said semiconductor body;

b. filling the space between all adjacent interconnect lines having a distance therebetween no greater than a given distance with an insulating material having a dielectric constant lower than the dielectric constant of silicon dioxide and greater than or equal to one, and leaving an unfilled open field area between adjacent interconnect lines having a distance therebetween greater than said given distance;

c. depositing a first layer of silicon dioxide over said interconnect lines, said open field area and said insulating material.

2. A method of forming a multi-level metal interconnect having reduced line-to-line capacitance on a semiconductor body, comprising the steps of:

a. depositing a first layer of metal over said semiconductor body;

b. etching said first metal layer to form a first plurality of spaced interconnect lines, some of said first plurality of interconnect lines being spaced from some other of said first plurality of interconnect lines by a distance of W and some of said first plurality of interconnect lines being spaced from other of said first plurality of interconnect lines by a distance of W' where W is greater than W';

c. depositing a first organic polymer layer over said semiconductor body and said first plurality of interconnect lines to a thickness less than W divided by twice the step coverage said organic polymer having a dielectric constant less than 3.9 and greater than or equal to one;

d. etching said first organic polymer layer back to expose an upper surface of said first plurality of interconnect lines and an open field area on said semiconductor body comprising the region between adjacent interconnect lines separated by more than W';

e. depositing a first silicon dioxide layer over said first plurality of interconnect lines, said open field area and said first organic polymer layer;

f. planarizing said first silicon dioxide layer;

g. selectively etching contact holes through said first silicon dioxide layer to at least some of said first plurality of interconnect lines; and h. filling said contact holes with a second layer of metal.

i. depositing a third layer of metal over said first silicon dioxide layer;

j. etching said third metal layer to form a second plurality of spaced interconnect lines, some of said second plurality of interconnect lines being spaced from some other of said second plurality of interconnect lines by a distance of W and some of said second plurality of interconnect lines being spaced from other of said second plurality of interconnect lines by a distance of W' where W is greater than W';

k. depositing a second organic polymer layer over said first silicon dioxide layer and said second plurality of interconnect lines to a thickness less than W divided by twice the step coverage, said second organic polymer layer having a dielectric constant less than 3.9 and greater than or equal to one;

l. etching said second organic polymer layer back to expose an upper surface of said second plurality of interconnect lines and at least a portion of said first silicon dioxide layer disposed between two of said second plurality of spaced interconnect lines comprising a second open field area between adjacent interconnect lines in said second plurality of interconnect lines separated by more than W';

m. depositing a second silicon dioxide layer over said second plurality of interconnect lines, said exposed first silicon dioxide layer and said second organic polymer layer; and n. planarizing said second silicon dioxide layer.

3. The method of claim 1, wherein said insulating material comprises an organic polymer.

4. The method of claim 3, wherein said organic polymer comprises a material selected from the group consisting of TEFLON, BCB, parylene, polyimide, and derivatives thereof.

5. The method of claim 1, wherein said insulating material comprises an inorganic material.

6. The method of claim 1, wherein said step of filling the space comprises vapor deposition to form a conformal layer of said insulating material.

7. The method of claim 1, wherein said step of filling the space includes the steps of:

depositing a conformal layer of said insulating material over said body and said spaced interconnect lines; and etching said insulating material to expose the upper surface of said interconnect lines and to expose an open field area on the semiconductor body between adjacent interconnect lines having a distance therebetween greater than said given distance.

8. The method of claim 1 further comprising the steps of:

a. etching a contact via through said first layer of silicon dioxide to one of said first plurality of interconnect lines; and b. filling said contact via with a conductive material.

9. The method of claim 1, further comprising the steps of:

a. forming a second plurality of spaced interconnect lines on said first layer of silicon dioxide;

b. filling the space between all of said second plurality of spaced interconnect lines having a distance therebetween no greater than said given distance with said insulating material and leaving an unfilled a second open field area between adjacent interconnect lines of said second plurality of spaced interconnect lines having a distance therebetween greater than said given distance; and c. depositing a second layer of silicon dioxide over said second plurality of interconnect lines, said second open field area and said insulating material disposed between said spaced interconnect lines of said second plurality of interconnect lines having a distance therebetween no greater than said given distance.

10. The method of claim 1 further comprising the step of planarizing said first silicon dioxide layer.

11. A method of forming a multi-level metal interconnect having reduced line-to-line capacitance on a semiconductor body, comprising the steps of:

a. depositing a first layer of metal over said semiconductor body;

b. etching said first metal layer to form a first plurality of spaced interconnect lines;

c. depositing a first organic polymer layer over said semiconductor body and said first plurality of interconnect lines to a thickness less than a selected interconnect spacing divided by twice the step coverage, said organic polymer having a dielectric constant less than 3.9 and greater than or equal to one;

d. etching said first organic polymer layer back to expose an upper surface of said first plurality of interconnect lines, said organic polymer between interconnect lines separated by less than said selected interconnect spacing and an open field area on said semiconductor body comprising the region between adjacent interconnect lines separated by more than said selected interconnect spacing;

e. depositing a first silicon dioxide layer over said first plurality of interconnect lines, said open field area and said first organic polymer layer;

f. planarizing said first silicon dioxide layer;

g. etching contact holes through said first silicon dioxide layer to at least some of said first plurality of interconnect lines; and h. filling said contact holes with a second layer of metal.

12. The method of claim 11, further comprising the steps of:

a. depositing a third layer of metal over said first silicon dioxide layer;

b etching said third metal layer to form a second plurality of spaced interconnect lines;

c. depositing a second organic polymer layer over said first silicon dioxide layer and said second plurality of interconnect lines to a thickness less than said selected interconnect spacing divided by twice the step coverage, said second organic polymer layer having a dielectric constant less than 3.9 and greater than or equal to one;

d. etching said second organic polymer layer back to expose an upper surface of said second plurality of interconnect lines, said organic polymer between said second plurality of interconnect lines separated by less than said selected interconnect spacing and at least a portion of said first silicon dioxide layer comprising a second open field area disposed between any two of said second plurality of spaced interconnect lines separated by more than said selected interconnect spacing;

e. depositing a second silicon dioxide layer over said second plurality of interconnect lines, said second open field area and said second organic polymer layer; and f. planarizing said second silicon dioxide layer.

* * * * *